United States Patent
Li et al.

(10) Patent No.: US 9,397,084 B1
(45) Date of Patent: Jul. 19, 2016

(54) STRUCTURE OF ESD PROTECTION CIRCUITS ON BEOL LAYER

(71) Applicant: UNITED MICROELECTRONICS CORP., Hsin-Chu (TW)

(72) Inventors: Shin-Hung Li, Nantou County (TW); Fan-Chi Meng, Hsinchu (TW); Shan-Shi Huang, Hsinchu (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/636,122

(22) Filed: Mar. 2, 2015

(51) Int. Cl.
| | |
|---|---|
| *H01L 27/02* | (2006.01) |
| *H01L 21/822* | (2006.01) |
| *H01L 23/528* | (2006.01) |
| *H01L 23/50* | (2006.01) |
| *H01L 29/66* | (2006.01) |
| *H01L 23/00* | (2006.01) |
| *H01L 21/768* | (2006.01) |

(52) U.S. Cl.
CPC .......... *H01L 27/0255* (2013.01); *H01L 21/768* (2013.01); *H01L 21/822* (2013.01); *H01L 23/50* (2013.01); *H01L 23/528* (2013.01); *H01L 24/11* (2013.01); *H01L 24/13* (2013.01); *H01L 24/43* (2013.01); *H01L 24/45* (2013.01); *H01L 27/0296* (2013.01); *H01L 29/6609* (2013.01); *H01L 2224/0401* (2013.01); *H01L 2224/04042* (2013.01)

(58) Field of Classification Search
None
See application file for complete search history.

(56) References Cited

U.S. PATENT DOCUMENTS

| 6,442,008 | B1* | 8/2002 | Anderson | ........... H01L 27/0259 361/111 |
|---|---|---|---|---|
| 8,860,081 | B2* | 10/2014 | Fukuoka | ............. H01L 27/0255 257/173 |
| 9,230,952 | B2* | 1/2016 | Hirose | .................... H01L 23/62 |
| 2002/0033504 | A1* | 3/2002 | Ohnakado | ........... H01L 27/0255 257/350 |
| 2004/0105203 | A1* | 6/2004 | Ker | ........................ H01L 21/84 361/56 |
| 2006/0017139 | A1* | 1/2006 | Eguchi | ............. G02F 1/136204 257/656 |
| 2007/0284666 | A1* | 12/2007 | Duvvury | ............. H01L 27/0255 257/360 |
| 2013/0044532 | A1 | 2/2013 | Bethune | |

OTHER PUBLICATIONS

Ker, Ming-Dou, and Chyh-Yih Chang. "ESD Protection Design for CMOS RF Integrated Circuits Using Polysilicon Diodes." Microelectronics Reliability 42.6 (2002): 863-72.*

Xu, N., "Beol and 3-D Integration" Lecture 17, EE 290D U.C. Berkeley, Dec. 4, 2013, downloaded from URL<http://www-inst.eecs.berkeley.edu/~ee290d/fa13/LectureNotes/Lecture17.pdf> Feb. 22, 2016.*

(Continued)

*Primary Examiner* — Joseph Schoenholtz
(74) *Attorney, Agent, or Firm* — Winston Hsu; Scott Margo

(57) ABSTRACT

A structure of ESD protection circuits on a BEOL layer includes a substrate. A plurality of interconnect layers and an inter-level dielectric layer are disposed on the substrate. The inter-level dielectric layer is disposed between the plurality of interconnect layers. The last layer of the interconnect layers comprises an I/O pad, a first pad and a second pad. A first diode and a second diode are disposed on the last layer of the inter-level dielectric layer, wherein the first diode electrically connects to the I/O pad and the first pad and the second diode electrically connects to the I/O pad and the second pad.

18 Claims, 5 Drawing Sheets

(56) References Cited

OTHER PUBLICATIONS

Karnik, S., et. al., "Lateral Polysilicon p+-P-n+ and p+-n-n+ diodes" Solid State Electronics 47 (2003) pp. 653-659).*

Kaneko, 2011, A Novel Beol Transistor (BETr) with InGaZnO Embedded in Cu-Interconnects for On-chip High Voltage I/Os in Standard CMOS LSIs, symposium on VLSI technology digest of technical papers, pp. 120-121, Jun. 14, 2011.

* cited by examiner

STRUCTURE OF ESD PROTECTION CIRCUITS ON BEOL LAYER

BACKGROUND OF THE INVENTION

1. Field of the Invention

The present invention relates to a structure of ESD protection circuits on a BEOL layer and a method of fabricating the same.

2. Description of the Prior Art

There are various types of circuits which protect against Electrostatic Discharge (ESD). ESD means a discharge from an electrostatically charged person or machine to a semiconductor device, a discharge from a charged semiconductor device to earth, and the like. When ESD occurs in a semiconductor device, a large amount of electric charge flows from the terminals of the semiconductor device into the semiconductor device, which raises the voltage inside the semiconductor device and may cause a dielectric breakdown of the internal circuits of the semiconductor device.

Conventional ESD protection circuits are disposed at a same level of the internal circuits. These circuits occupy too much space, however, which influences the potential miniaturization of the semiconductor device.

SUMMARY OF THE INVENTION

According to one embodiment, a method of fabricating ESD protection circuits on a BEOL layer includes providing a substrate. A back-end-of-line process is then performed to form a plurality of interconnect layers on the substrate and to form an inter-level dielectric layer between the plurality of interconnect layers, wherein the last layer of the interconnect layers comprises an I/O pad, a first pad and a second pad. Finally, a first diode and a second diode are formed on the last layer of the inter-level dielectric layer, wherein the first diode electrically connects to the I/O pad and the first pad and the second diode electrically connects to the I/O pad and the second pad.

According to another embodiment, a structure of ESD protection circuits on a BEOL layer includes a substrate. A plurality of back-end-of-line layers are disposed on the substrate, wherein the back-end-of-line layers comprise a plurality of interconnect layers and an inter-level dielectric layer between the plurality of interconnect layers, and the last layer of the interconnect layers comprises an I/O pad, a first pad and a second pad. A first diode and a second diode are disposed on the last layer of the inter-level dielectric layer, wherein the first diode electrically connects to the I/O pad and the first pad and the second diode electrically connects to the I/O pad and the second pad.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
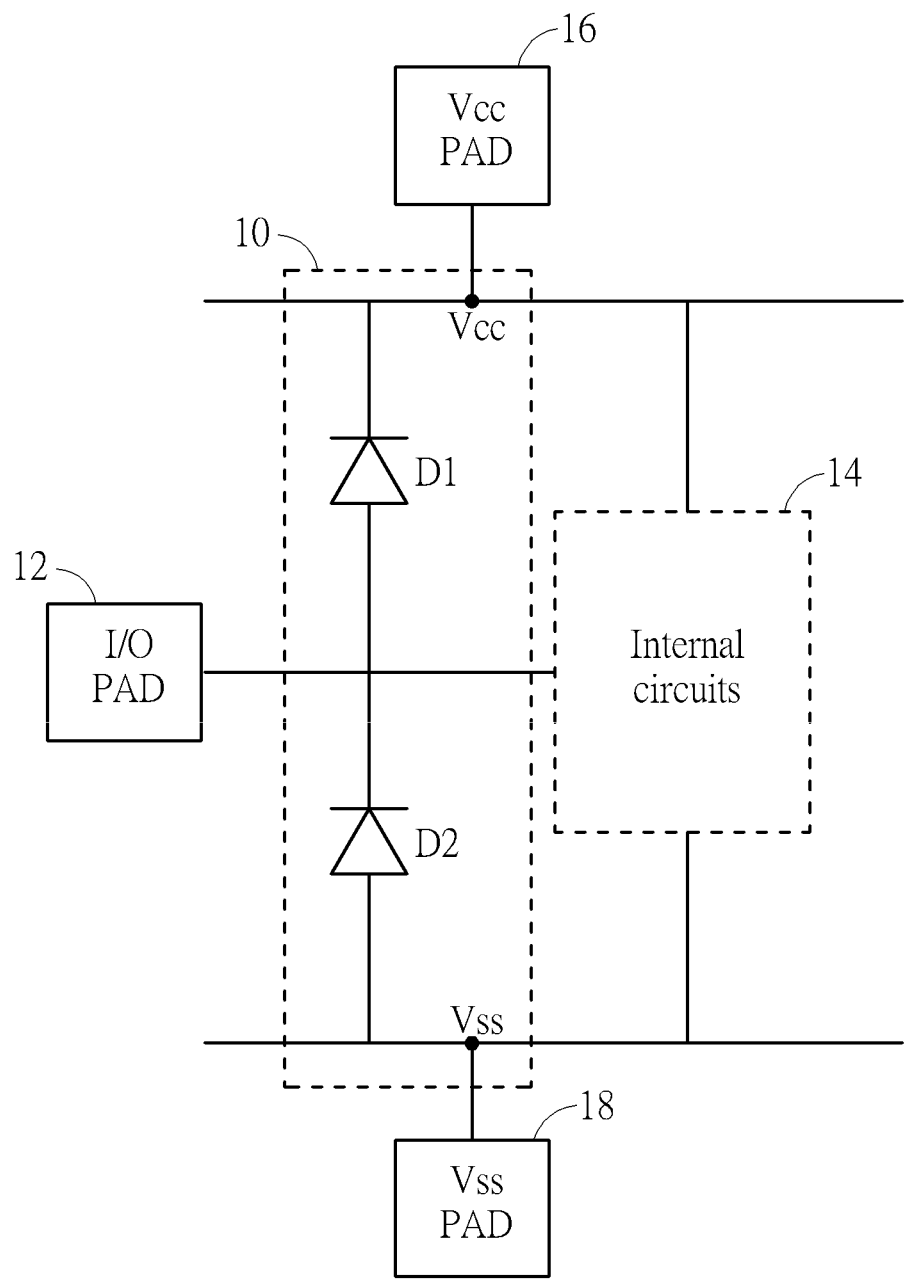
FIG. 1 illustrates an electrostatic discharge (ESD) protection circuit according to a preferred embodiment of the present invention.

FIG. 1 illustrates an electrostatic discharge (ESD) protection circuit according to a preferred embodiment of the present invention. As shown in FIG. 1, an ESD protection circuit 10 includes two series-connected diodes D1/D2. The diodes D1/D2 are both reverse biased under normal operating conditions. The ESD protection circuit 10 is connected between an I/O pad 12 and an internal circuit 14 for protecting the internal circuit 14 from ESD damage. In one embodiment, the internal circuit 14 may be a single chip, a timing controller, a driving circuit, an I/O interface circuit, a sense amplifier circuit, a digital analog converter (DAC), a decoder buffers, an address buffers, or a cell arrays. The diode D1 is formed between an operational voltage node Vcc and the I/O pad 12. The diode D2 is formed between a ground voltage node Vss and the I/O pad 12. A Vcc pad 16 is electrically connected to the operational voltage node Vcc. A Vss pad 18 is electrically connected to the ground voltage node Vss.

If a positive ESD pulse comes into the I/O pad 12, raising the voltage on the I/O pad 12 above the voltage of the operational voltage node Vcc, the diode D1 will conduct and the positive ESD pulse is discharged via the diode D1 to Vcc pad 16. Similarly, if a negative ESD pulse comes into the I/O pad 12, making the voltage on the I/O pad 12 fall below the voltage of the ground voltage node Vss, the diode D2 will conduct and the negative ESD pulse is discharged via the diode D2 to Vss pad 18.

Figure 2:
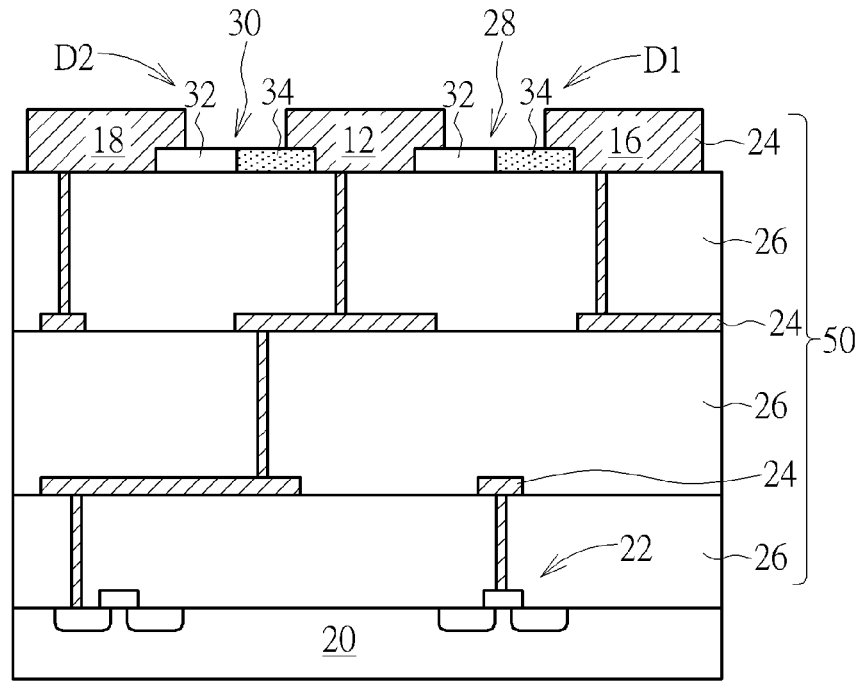
FIG. 2 to FIG. 3 illustrate a fabricating process according to a first preferred embodiment of the present invention.
Figure 3:
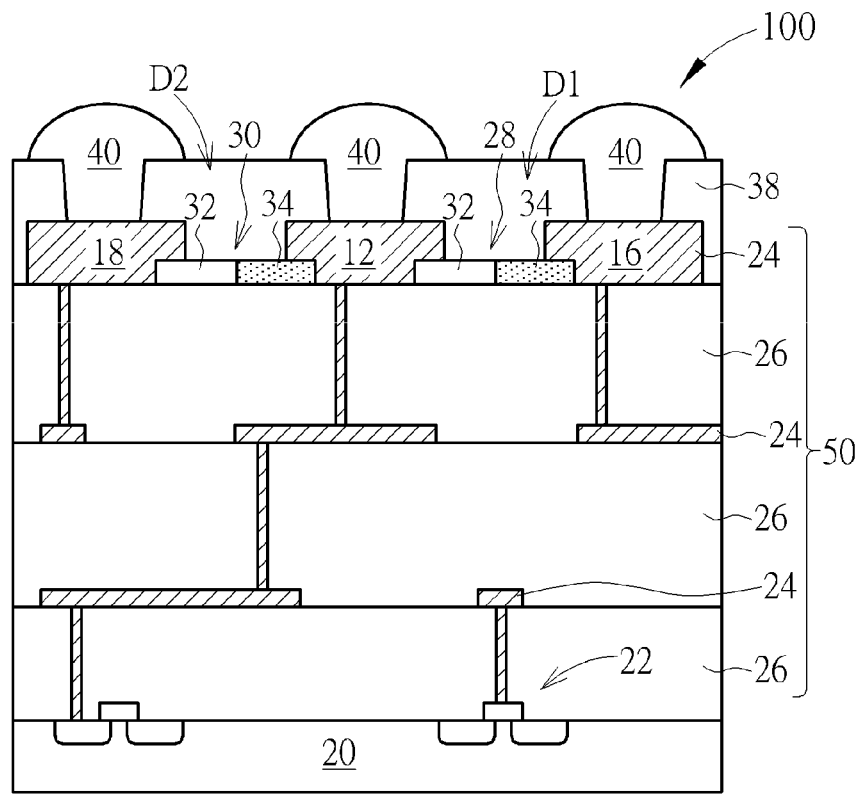

One of the features of the present invention is that the ESD protection circuit 10 of the present invention is disposed on the last layer of the back end of line (BEOL) layer. FIG. 2 to FIG. 3 illustrate a fabricating process according to a first preferred embodiment of the present invention, wherein like reference numerals are used to refer to like elements throughout.

As shown in FIG. 2, a substrate 20 is provided. At least one active element such as a transistor 22 is formed on the substrate 10. There may be numerous transistors 22 to serve as the internal circuit 14 mentioned in FIG. 1. As shown in FIG. 2 and FIG. 3, a back-end-of-line process is performed to form a plurality of interconnect layers 24 on the substrate 10 and to form an inter-level dielectric layer 26 between the plurality of interconnect layers 24. The interconnect layer 24 usually contains metal lines and plugs. The inter-level dielectric layer 26 preferably includes dielectrics such as silicon nitride, silicon oxide, silicon oxynitride, etc. The last layer of the interconnect layers 24 will have metal pads fabricated therein which electrically connect with the metal lines disposed underneath the last layer of the interconnect layers 24. The metal pads are typically used as bonding sites to connect a chip with other system components.

Referring back to FIG. 2, before the last layer of the interconnect layers 24 is formed, an ESD protection circuit including a first diode D1 and a second diode D2 are formed on the last layer of the inter-level dielectric layer 26. The steps of forming the first diode D1 and the second diode D2 includes first forming a first type semiconductor material (not shown) on the last layer of the inter-level dielectric layer 26. The first type semiconductor material may be silicon containing first type dopants and formed by an in situ doping process at low temperature. Later, the first type semiconductor material is patterned into a first segment 28 and a second segment 30 by taking a first mask (not shown) as a mask. The first segment 28 and the second segment 30 do not contact each other. Later, the first segment 28 and the second segment 30 are partly doped by second type dopants to divide both the first segment 28 and the second segment 30 into a first type semiconductor layer 32 and a second type semiconductor layer 34. The first type semiconductor layer 32 contains the first type dopants, and the second type semiconductor layer 34 contains the second type dopants. The first type dopant can be p-type or n-type. The second type dopant can be p-type or n-type, as long as the second type is different from the first type. The first type semiconductor layer 32 and the second type semiconductor layer 34 in the first segment 28 constitute the first diode D1. The first type semiconductor layer 32 and the second type semiconductor layer 34 in the second segment 30 constitute the second diode D2. The first type semiconductor layer 32 is parallel to the second type semiconductor layer 34. The first type semiconductor layer 32 preferably does not overlap the second type semiconductor layer 34.

The first diode D1 and the second diode D2 can be formed by another method, which is detailed as follows. First, a semiconductor material (not shown) is formed on the last layer of the inter-level dielectric layer 26. Then, the semiconductor material is patterned into a first segment 28 and a second segment 30. Then, the first type dopants are partly implanted into the first segment 28 partly and the second segment 30. The first segment 28 and the second segment 30 implanted with first type dopants turns into a first type semiconductor layer 32. Similarly, the second type dopants are partly implanted into the first segment 28 and the second segment 30 to form a second type semiconductor layer 34 in the first segment 28 and the second segment 30.

Figure 4:
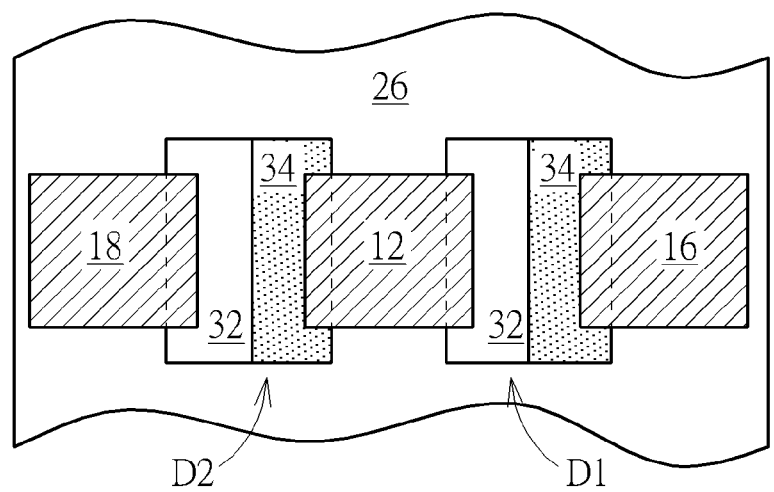
FIG. 4 shows relative positions of the first diode, the second diode and the last layer of the interconnect layers from a top view according to the first preferred embodiment of the present invention.

FIG. 4 shows relative positions of the first diode, the second diode and the last layer of the interconnect layers from a top view according to the first preferred embodiment of the present invention. Referring to FIG. 3 and FIG. 4, after the first diode D1 and the second diode D2 are formed, the last layer of the interconnect layers 24 is formed to cover the first diode D1 and the second diode D2. The last layer of the interconnect layers 24 includes metal pads such as an I/O pad 12 for sending input and output signal, a Vcc pad 16 for coupling an operational voltage node Vcc and a Vss pad 18 for coupling a ground voltage node Vss. The first diode D1 and the second diode D2 electrically connect to the I/O pad 12, the Vcc pad 16 and the Vss pad 18. More specifically, the I/O pad 12 contacts the first type semiconductor layer 32 of the first diode D1 and the second type semiconductor layer 34 of the second diode D2. The Vss pad 18 contacts the first type semiconductor layer 32 of the second diode D2. The Vcc pad 16 contacts the second type semiconductor layer 34 of the first diode D1. The I/O pad 12, the Vcc pad 16 and the Vss pad 18 directly contact the last layer of the inter-level dielectric layer 26.

Figure 5:
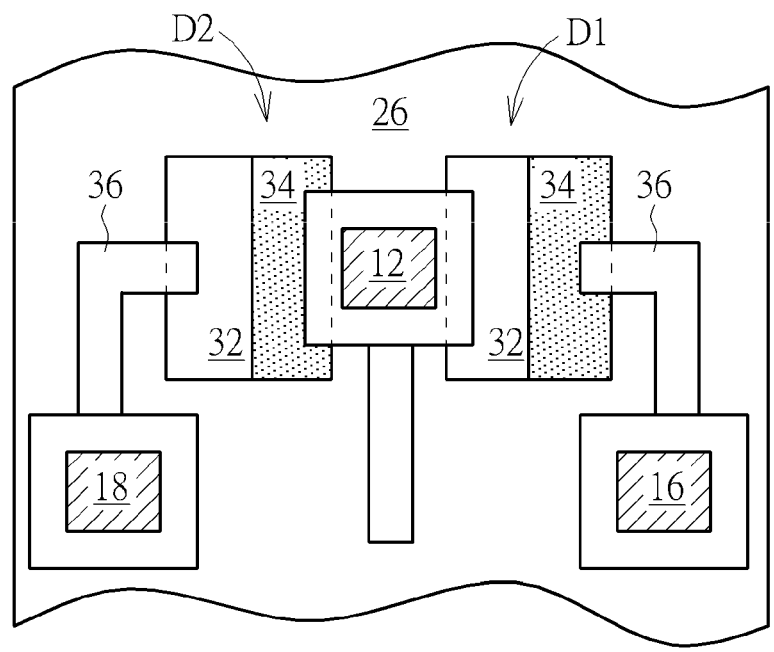
FIG. 5 shows relative positions of the first diode, the second diode and the last layer of the interconnect layers from a top view according to another preferred embodiment of the present invention.

FIG. 5 shows relative positions of the first diode, the second diode and the last layer of the interconnect layers from a top view according to another preferred embodiment of the present invention. As shown in FIG. 5, the Vcc pad 16 and the Vss pad 18 can electrically connect to the first diode D1 and the second diode D2 by metal routing or a redistribution layer. That is, the Vcc pad 16 does not directly contact the second type semiconductor layer 34 of the first diode D1. The Vcc pad 16 electrically connects to the first diode D1 through a metal line 36. Similarly, the Vss pad 18 does not contact the first type semiconductor layer 32 of the second diode D2. The Vss pad 18 electrically connects to the second diode D2 through a metal line 36.

Referring back to FIG. 3, after the I/O pad 12, the Vcc pad 16 and the Vss pad 18 are formed, a passivation layer 38 is formed to cover the I/O pad 12, the Vcc pad 16 and the Vss pad 18. Thereafter, openings in the passivation layer 38 are formed to expose the I/O pad 12, the Vcc pad 16 and the Vss pad 18. Then, a wire bond (not shown) or a solder bump 40 is formed in each opening to electrically connect the I/O pad 12, the Vcc pad 16 and the Vss pad 18. At this point, a structure of ESD protection circuits on a BEOL layer 100 is completed.

Figure 6:
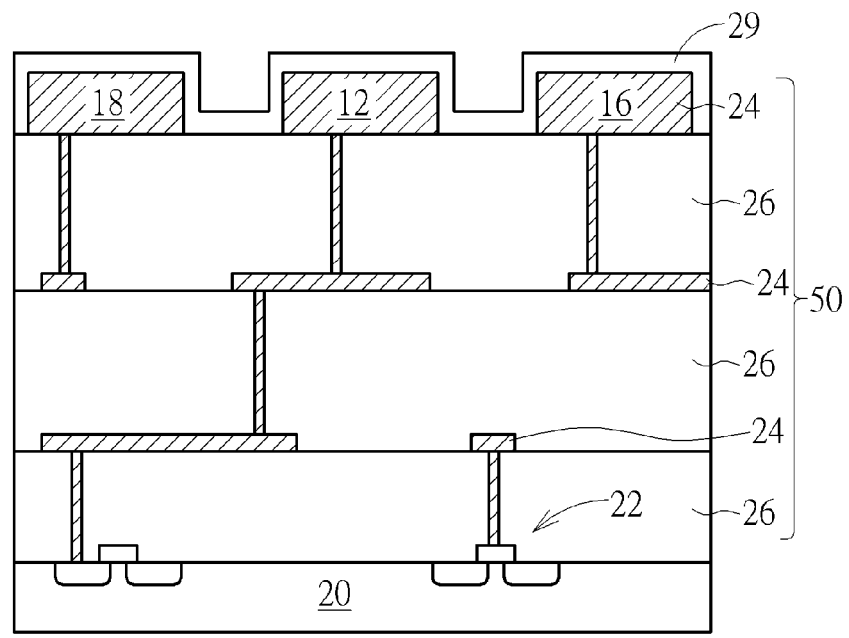
FIG. 6 to FIG. 7 illustrate a fabricating process according to a second preferred embodiment of the present invention.
Figure 7:
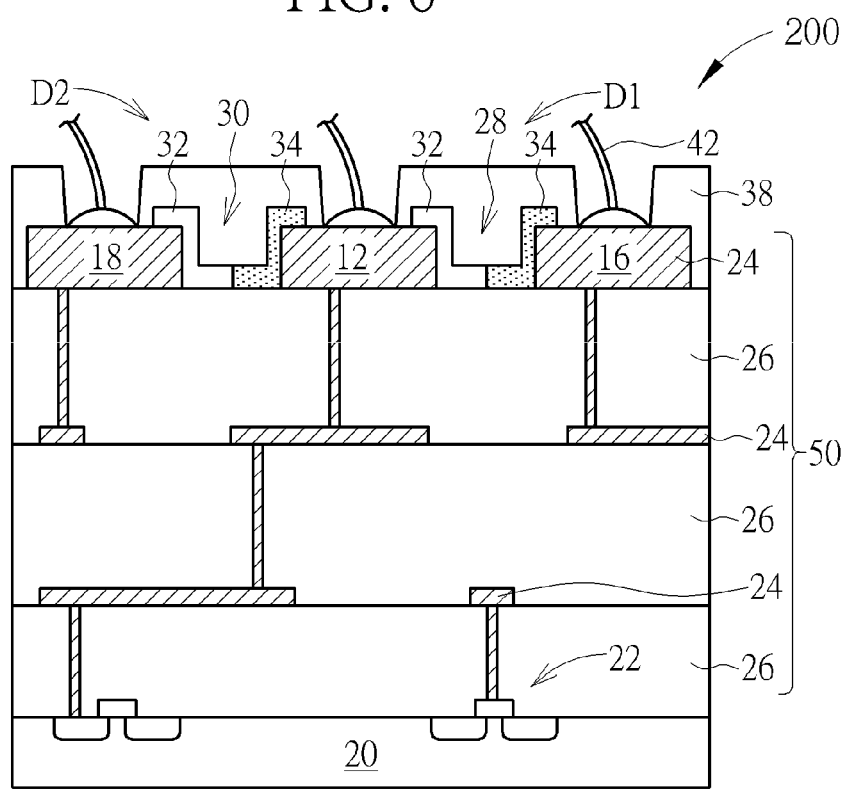

FIG. 6 to FIG. 7 illustrate a fabricating process schematically according to a second preferred embodiment of the present invention, wherein like reference numerals are used to refer to like elements throughout. The difference between the first preferred embodiment and the second preferred embodiment is that, in the second embodiment, the first diode D1 and the second diode D2 are formed after the last layer of the interconnect layers 24 is formed.

Referring to FIG. 6, a substrate 20 is provided. At least one active element such as a transistor 22 is formed on the substrate. Then, a back-end-of-line process is performed to form a plurality of interconnect layers 24 on the substrate 20 and to form an inter-level dielectric layer 26 between the plurality of interconnect layers 24. The last layer of the interconnect layers 24 has metal pads such as an I/O pad 12, a Vcc pad 16 and a Vss pad 18. The I/O pad 12, the Vcc pad 16 and the Vss pad 18 directly contact the last layer of the inter-level dielectric layer 26.

Later, a first type semiconductor material 29 is conformally formed on the I/O pad 12, the Vcc pad 16 and the Vss pad 18 and covers the last layer of the inter-level dielectric layer 26. The following processes of patterning the first type semiconductor material 29 into two segments, and implanting second type dopants into the segments are the same as those illustrated in FIG. 2, and details are therefore omitted. As shown in FIG. 7, after the first type semiconductor material 29 is patterned and after the second type dopants are implanted, a first diode D1 is formed on the I/O pad 12 and the Vcc pad 16. A second diode D2 is formed on the I/O pad 12 and the Vss pad 18.

Similarly, the first diode D1 and the second diode D2 can be formed by forming a semiconductor material, then patterning the semiconductor material followed by two implantation process. One implantation process is for doping the first-type dopants, and the other implantation process is for doping the second-type dopants.

In this preferred embodiment, the I/O pad 12, the Vss pad 18 and the Vcc pad 16 can electrically connect to the first diode D1 and the second diode D2 by direct contact as shown in FIG. 4. Alternatively, the I/O pad 12, the Vss pad 18 and the Vcc pad 16 can electrically connect to the first diode D1 and the second diode D2 by a metal line 36 as shown in FIG. 5.

Referring to FIG. 7, a passivation layer 38 is formed to cover the I/O pad 12, the Vcc pad 16 and the Vss pad 18. Thereafter, openings in the passivation layer 38 are formed to expose the I/O pad 12, the Vcc pad 16 and the Vss pad 18. Then, a wire bond 42 or a solder bump (not shown) is formed in each opening to electrically connect the I/O pad 12, the Vcc pad 16 and the Vss pad 18. At this point, a structure of ESD protection circuits on a BEOL layer 200 is completed.

Figure 8:
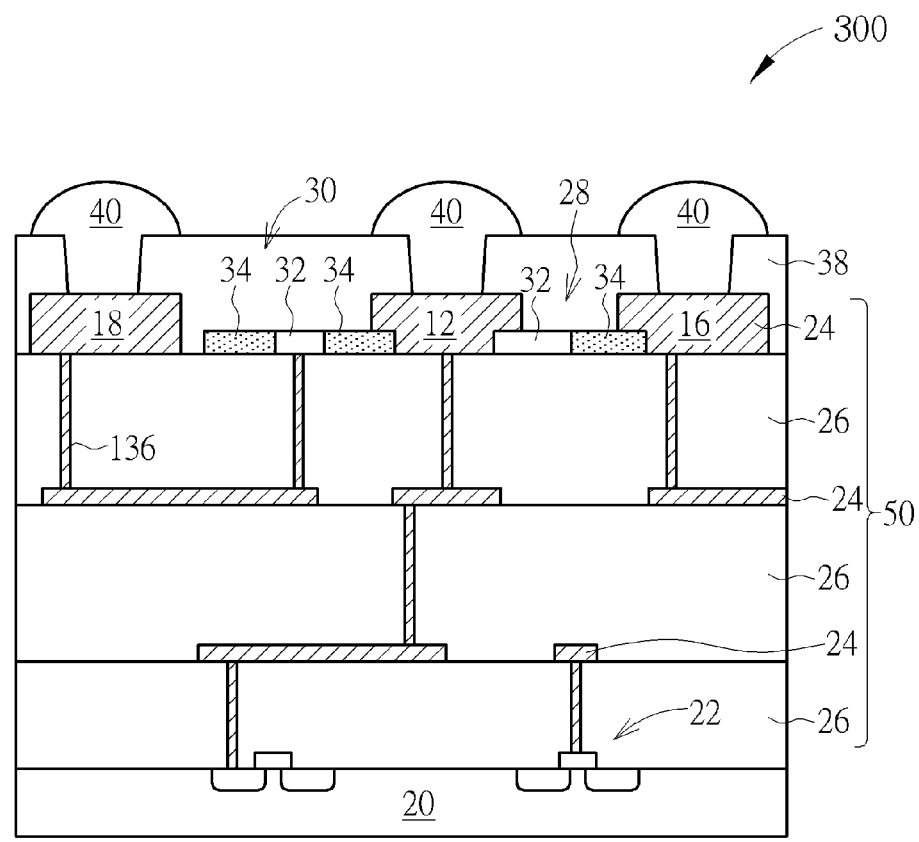
FIG. 8 shows a modification of the first preferred embodiment of the present invention.
Figure 9:
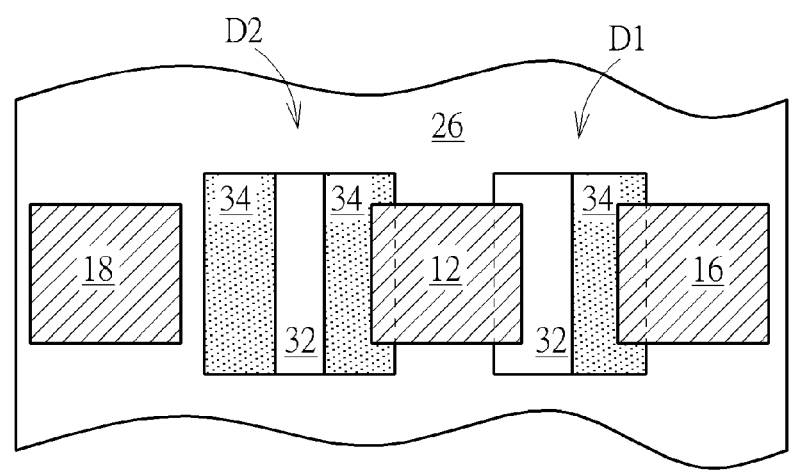
FIG. 9 shows relative positions of the first diode, the second diode and the last layer of the interconnect layers from a top view according to the modification of the first preferred embodiment.

FIG. 8 shows a modification of the first preferred embodiment of the present invention. FIG. 9 shows relative positions of the first diode, the second diode and the last layer of the interconnect layers from a top view according to the modification of the first preferred embodiment. As shown in FIG. 8 and FIG. 9, the fabricating process of ESD protection circuits on a BEOL layer 300 is basically the same as that in the first preferred embodiment, with the difference being that the second type semiconductor layer 34 surrounds the first type semiconductor layer 32 in the second diode D2. The Vss pad 18 electrically connects to the first type semiconductor layer 32 through a metal line 136 beneath the last layer of the interconnect layers 24. Although this embodiment only shows the second diode D2 having the second type semiconductor layer 34 surrounding the first type semiconductor layer 32, the first diode D1 can be changed to have the first type semiconductor layer 32 surrounding the second type semiconductor layer 34.

Moreover, the first diode D1 and the second diode D2 in the second preferred embodiment can be changed to have the first type semiconductor layer 32 surrounding the second type semiconductor layer 34 or the second type semiconductor layer 34 surrounding the first type semiconductor layer 32.

FIG. 3 and FIG. 4 show a structure of ESD protection circuits on a BEOL layer 100 according to a third preferred embodiment of the present invention. As shown in FIG. 3 and FIG. 4, a structure of ESD protection circuits on a BEOL layer 100 includes a substrate 20. The substrate 20 may be a low temperature polysilicon (LTPS), a bulk silicon substrate, a germanium substrate, a gallium arsenide substrate, a silicon germanium substrate, an indium phosphide substrate, a gallium nitride substrate, a silicon carbide substrate, or a silicon on insulator (SOI) substrate. At least one active element such as a transistor 22 is formed on the substrate 20. There may be numerous transistors 22 which serve as an internal circuit 14 shown in FIG. 1. Numerous back-end-of-line layers 50 are disposed on the substrate 20 and cover the transistor 22. The back-end-of-line layers include numerous interconnect layers 24 and an inter-level dielectric layer 26 disposed between interconnect layers 24. The last layer of the interconnect layers 24 comprises an I/O pad 12, a Vss pad 18 and a Vcc pad 16. A first diode D1 and a second diode D2 are disposed on and contact the last layer of the inter-level dielectric layer 26. Both the first diode D1 and the second diode D2 comprise a first type semiconductor layer 32 and a second type semiconductor layer 34, and the first type semiconductor layer 32 is parallel to the second type semiconductor layer 34. The first diode D1 and the second diode D2 overlap the internal circuit 14. The first type dopant can be p-type or n-type. The second type dopant can be p-type or n-type, as long as the second type is different from the first type.

The first diode D1 electrically connects to the I/O pad 12 and the Vcc pad 16 and the second diode D1 electrically connects to the I/O pad 12 and the Vss pad 18. The I/O pad 12, the Vcc pad 16 and the Vss pad 18 directly contact the last layer of the inter-level dielectric layer 26, and the first diode D1 and the second diode D2 are under the I/O pad 12. The first diode D1 directly contacts the Vcc pad 16 and the I/O pad 12. The second diode D1 directly contacts the Vss pad 18 and the I/O pad 12. A solder bump 40 is electrically connected to the Vcc pad 16, the Vss pad 18 and the I/O pad 12 respectively.

As shown in FIG. 5, the first diode D1 can electrically connect to the I/O pad and the Vcc pad through a metal line 36. The second diode D2 can electrically connect to the I/O pad 12 and the Vss pad 18 through a metal line 36 or a redistribution layer (not shown).

According to another preferred embodiment of the present invention, as shown in FIG. 7, the first diode D1 is on top of the Vcc pad 16 and the I/O pad 12 and the second diode D2 is on top of the Vss pad 18 and the I/O pad 12. Furthermore, a wire bond 42 is electrically connected to the Vcc pad 16, the Vss pad 18 and the I/O pad 12 respectively.

According to another preferred embodiment of the present invention, as shown in FIG. 8 and FIG. 9, the second diode D2 can have a configuration where the second type semiconductor layer 34 surrounds the first type semiconductor layer 32. Although this embodiment only shows the second diode D2 having the second type semiconductor layer 34 surrounding the first type semiconductor layer 32, the first diode D1 can be changed to have the first type semiconductor layer 32 surrounding the second type semiconductor layer 34.

Conventional ESD protection circuits are disposed at a same layer of the internal circuit. Because these ESD protection circuits occupy a large space, the miniaturization of the semiconductor device is obstructed. The ESD protection circuits of the present invention are disposed above the internal circuits, and more particularly are disposed on the BEOL layer. In this way, space in the internal circuits can be saved, and the size of the core circuit can be reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating ESD protection circuits on a BEOL layer, comprising:
   providing a substrate;
   performing a back-end-of-line process to form a plurality of interconnect layers on the substrate and to form an inter-level dielectric layer between the plurality of interconnect layers, wherein the last layer of the interconnect layers comprises an I/O pad, a first pad and a second pad; and
   forming a first diode and a second diode on the last layer of the inter-level dielectric layer, wherein the first diode electrically connects to the I/O pad and the first pad and the second diode electrically connect to the I/O pad and the second pad.

2. The method of fabricating ESD protection circuits on a BEOL layer of claim 1, further comprising:
   before forming the last layer of the interconnect layers, forming the first diode and the second diode on the last layer of the inter-level dielectric layer.

3. The method of fabricating ESD protection circuits on a BEOL layer of claim 1, wherein steps of forming the first diode comprises:
   forming a first segment on the last layer of the inter-level dielectric layer, wherein the first segment is made from a first type semiconductor material containing first type dopants; and
   doping a first part of the first segment by second type dopants to form a second type semiconductor layer, wherein a second part of the first segment is defined as a first type semiconductor layer, the first type semiconductor layer contains first type dopants, and the first type semiconductor layer in the first segment and the second type semiconductor layer in the first segment form the first diode.

4. The method of fabricating ESD protection circuits on a BEOL layer of claim 1, wherein steps of forming the first diode comprises:

forming a first segment made of a semiconductor material on the last layer of the inter-level dielectric layer;

doping the first segment partly by first type dopants to form a first type semiconductor layer within the first segment; and doping the first segment partly by second type dopants to form a second type semiconductor layer within the first segment, wherein the first type semiconductor layer in the first segment and the second type semiconductor layer in the first segment form the first diode.

5. The method of fabricating ESD protection circuits on a BEOL layer of claim 1, wherein the first diode, the second diode, the I/O pad, the first pad and the second pad contact the last layer of the inter-level dielectric layer, and the first diode and the second diode are under the I/O pads.

6. The method of fabricating ESD protection circuits on a BEOL layer of claim 1, wherein the I/O pad, the first pad and the second pad contact the last layer of the inter-level dielectric layer, and the first diode is on top of the first pad and the I/O pad and the second diode is on top of the second pad and the I/O pad.

7. The method of fabricating ESD protection circuits on a BEOL layer of claim 1, further comprising:

forming one of a wire bond and a solder bump electrically connected to the first pad, the second pad and the I/O pad, respectively.

8. The method of fabricating ESD protection circuits on a BEOL layer of claim 1, further comprising:

before performing the back-end-of-line process, forming an active element on the substrate.

9. A structure of ESD protection circuits on a BEOL layer, comprising:

a substrate;

a plurality of back-end-of-line layers disposed on the substrate, wherein the back-end-of-line layers comprise a plurality of interconnect layers and an inter-level dielectric layer between the plurality of interconnect layers, and the last layer of the interconnect layers comprises an I/O pad, a first pad and a second pad; and a first diode and a second diode disposed on the last layer of the inter-level dielectric layer, wherein the first diode electrically connects to the I/O pad and the first pad and the second diode electrically connects to the I/O pad and the second pad.

10. The structure of ESD protection circuits on a BEOL layer of claim 9, wherein the first diode, the second diode, the I/O pad, the first pad and the second pad contact the last layer of the inter-level dielectric layer, and the first diode and the second diode are under the I/O pad.

11. The structure of ESD protection circuits on a BEOL layer of claim 9, wherein the first diode, the second diode, the I/O pad, the first pad and the second pad contact the last layer of the inter-level dielectric layer, and the first diode is on top of the first pad and the I/O pad and the second diode is on top of the second pad and the I/O pad.

12. The structure of ESD protection circuits on a BEOL layer of claim 9, wherein the first diode electrically connects to the first pad and the I/O pad through a metal line.

13. The structure of ESD protection circuits on a BEOL layer of claim 9, wherein the second diode electrically connects to the second pad and the I/O pad through a metal line.

14. The structure of ESD protection circuits on a BEOL layer of claim 9, further comprising one of a wire bond and a solder bump electrically connecting to the first pad, the second pad and the I/O pad, respectively.

15. The structure of ESD protection circuits on a BEOL layer of claim 9, wherein both the first diode and the second diode comprise a first type semiconductor layer and a second type semiconductor layer, and the first type semiconductor layer is parallel to the second type semiconductor layer.

16. The structure of ESD protection circuits on a BEOL layer of claim 9, wherein both the first diode and the second diode comprise a first type semiconductor layer and a second type semiconductor layer, and the second type semiconductor layer surrounds the first type semiconductor layer.

17. The structure of ESD protection circuits on a BEOL layer of claim 9, wherein when a positive pulse comes into the I/O pad, the positive pulse is discharged via the first diode to the first pad.

18. The structure of ESD protection circuits on a BEOL layer of claim 9, wherein when a negative pulse comes into the I/O pad, the negative pulse is discharged via the second diode to the second pad.

* * * * *